United States Patent [19]
Kalnitsky et al.

[11] Patent Number: 6,031,275
[45] Date of Patent: Feb. 29, 2000

[54] ANTIFUSE WITH A SILICIDE LAYER OVERLYING A DIFFUSION REGION

[75] Inventors: Alexander Kalnitsky, San Francisco; Albert Bergemont, Palo Alto; Pavel Poplevine, Foster City, all of Calif.

[73] Assignee: National Semiconductor Corporation, Santa Clara, Calif.

[21] Appl. No.: 09/211,618

[22] Filed: Dec. 15, 1998

[51] Int. Cl.$^7$ .................................................. H01L 29/00
[52] U.S. Cl. .......................... 257/530; 257/773; 257/665; 438/131
[58] Field of Search ................................... 257/529, 665, 257/530, 773, 755, 757, 209, 50; 438/601, 131, 132, 201, 215, 467, 469

[56] References Cited

U.S. PATENT DOCUMENTS

| | | | |
|---|---|---|---|
| 4,743,491 | 5/1988 | Asada et al. | 428/213 |
| 4,796,075 | 1/1989 | Whitten | 357/51 |
| 5,066,998 | 11/1991 | Fischer et al. | 357/51 |
| 5,233,206 | 8/1993 | Lee et al. | 257/50 |
| 5,708,291 | 1/1998 | Bohr et al. | 257/529 |
| 5,882,998 | 3/1999 | Sur, Jr. et al. | 438/601 |

OTHER PUBLICATIONS

Hamdy, E. et al., "Dielectric Based Antifuse For Logic and Memory IC's," International Electron Devices Meeting (Dec. 11–14, 1988) pp. 786–789.

Liu, D. et al, "Scaled Dielectric Antifuse Structure for Field–Programmable Gate Array Applications," IEEE Electron Devices Letters, vol. 12, No. 4, Apr. 1991, pp. 151–153.

Chen, K., et al. "A Sublithographic Antifuse Structure for Field–Programmable Gate Array Applications," IEEE Electron Devices Letters, vol. 13, No. 1, Jan. 1992, pp. 53–55.

*Primary Examiner*—Donald L. Monin, Jr.
*Attorney, Agent, or Firm*—Limbach & Limbach L.L.P.

[57] ABSTRACT

The large voltage required to program a conventional antifuse is substantially reduced by forming the antifuse with a diffusion region and an overlying layer of silicide. The silicide layer is contacted at opposite ends so that a current can flow in through contacts at one end, and out through contacts at the opposite end. When unprogrammed, a voltage is applied to the semiconductor material in which the diffusion region is formed to prevent the diffusion region to semiconductor material from being forward biased. The antifuse is programmed by heating the silicide layer until the silicide layer agglomerates. The silicide layer can be heated by passing a current through the silicide layer.

20 Claims, 3 Drawing Sheets

ANTIFUSE WITH A SILICIDE LAYER OVERLYING A DIFFUSION REGION

BACKGROUND OF THE INVENTION

1. Field of the Invention

The present invention relates to an antifuse and, more particularly, to an antifuse with a silicide layer overlying a diffusion region.

2. Description of the Related Art

Unlike a fuse which, when programmed, changes from a low-resistance to a high-resistance device that substantially blocks a current from flowing through the device, an antifuse is a device which, when programmed, changes from a high-resistance to a low-resistance device that allows a current to flow through the device.

FIG. 1 shows a cross-sectional drawing that illustrates a conventional antifuse 100. As shown in FIG. 1, antifuse 100 includes a N+ diffusion region 112 which is formed in a p-type substrate 110, and surrounded by isolating field oxide regions FOX.

In addition, as further shown in FIG. 1, antifuse 100 also includes an ONO (oxide-nitride-oxide) dielectric layer 114 which is formed on diffusion region 112, and a layer of N+ doped polysilicon (poly) 116 which is formed on dielectric layer 114.

In operation, due to the presence of dielectric layer 114, no current can flow from poly layer 116 to diffusion region 112 (or in the opposite direction) when normal operating voltages are applied to antifuse 100. This condition is typically referred to as the unprogrammed state.

On the other hand, when a strong electric field is established across dielectric layer 114, such as when a 16.5 volt pulse is applied to poly layer 116 while diffusion region 112 is grounded, dielectric layer 114 breaks down, thereby forming a conductive path between poly layer 116 and diffusion region 112. This condition, which is typically referred to as the programmed state, allows current to flow between poly layer 116 and region 112 when normal operating voltages are again applied to antifuse 100.

One of the problems with antifuse 100 is that, when incorporated into a circuit, such as a field programmable gate array, high voltage transistors must also be incorporated into the circuit to handle the high voltages (16.5V) which are required to program antifuse 100. The incorporation of high voltage transistors, in turn, increases the complexity and cost of the fabrication process used to produce the circuit.

Although programming voltages as low as 10.6 volts (with a nitride-oxide dielectric thickness of 65 Å) have been reported in the literature (see Chen et al., A Sublithographic Antifuse Structure for Field Programmable Gate Array Applications, *IEEE Electron Device Letters*, Vol. 13, No. 1, January 1992), it is desirable to have antifuses which can be programmed with much lower voltages, such as at or below the supply voltage, e.g., at or below 3.3V in a 0.35 micron process.

SUMMARY OF THE INVENTION

Conventionally, an antifuse is formed by separating two conductive regions with an insulator. As formed, the antifuse is unprogrammed in that the insulator prevents current from flowing between the two conductive regions.

A conventional antifuse is programmed by placing a large voltage across the insulator to break down the insulator which, in turn, forms a conductive path between the two conductive regions. In the present invention, the large voltage required for programming is substantially reduced by forming the antifuse with a diffusion region and an overlying layer of silicide.

In accordance with the present invention, an antifuse, which is formed in a semiconductor material of a first conductivity type, includes a diffusion region of a second conductivity type which is formed in the semiconductor material. The diffusion region has a first end and a second end which is spaced apart from the first end.

The antifuse also includes a layer of metal silicide which is formed over the diffusion region, and a layer of insulation material which is formed on the layer of metal silicide. The layer of insulation material has a first opening that exposes a surface region on the layer of metal silicide at the first end of the diffusion region, and a second opening that exposes a surface region on the layer of metal silide at the second end of the diffusion region.

In addition, the antifuse further includes a first contact which is formed in the first opening to contact the layer of metal silicide, and a second contact which is formed in the second opening to contact the layer of metal silicide. Further, a first interconnect is connected to the first contact, and a second interconnect is connected to the second contact such that the second interconnect is spaced apart from the first interconnect.

In operation, an unprogrammed antifuse is used by applying a voltage to the semiconductor material such that the diffusion region to semiconductor material junction is not forward biased when a voltage within a range of operating voltages is placed on the diffusion region.

The antifuse of the present invention is programmed by heating the layer of metal silicide until the layer of metal silicide agglomerates. The layer of metal silicide can be heated by passing a current through the layer of metal silicide. The current can be induced by applying a first voltage to the first interconnect, a second voltage to the second interconnect, and a third voltage to the semiconductor material where the first and second voltages are different, and the diffusion region to semiconductor material junction is not forward biased.

The current can also be induced to flow by setting the first and second voltages to be substantially equal, and the third voltage such that the diffusion region to semiconductor material junction is forward biased.

A better understanding of the features and advantages of the present invention will be obtained by reference to the following detailed description and accompanying drawings which set forth an illustrative embodiment in which the principles of the invention are utilized.

DETAILED DESCRIPTION

Figure 1:
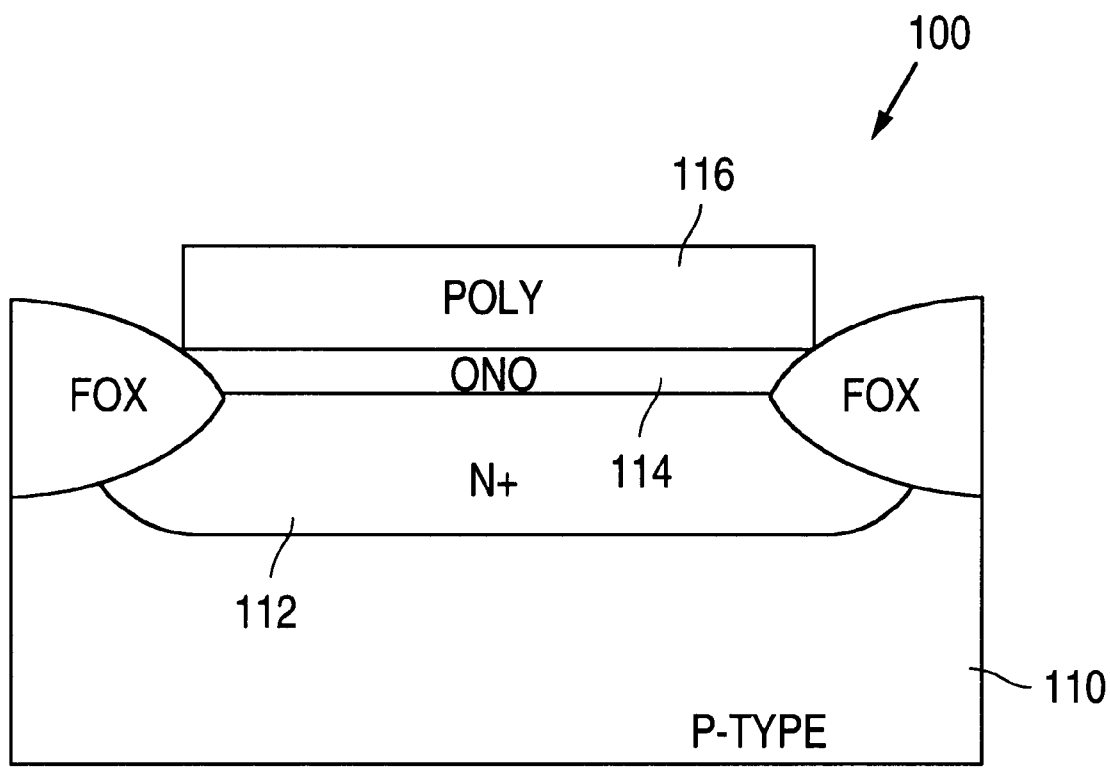
FIG. 1 is a cross-sectional diagram illustrating a conventional antifuse 100.
Figure 2:
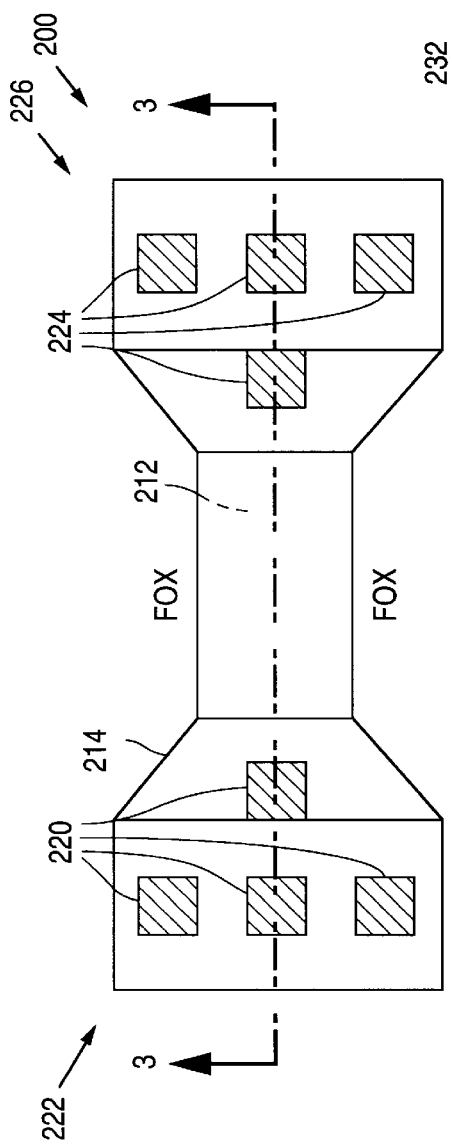
FIG. 2 is a plan view illustrating an antifuse 200 in accordance with the present invention.
Figure 3:
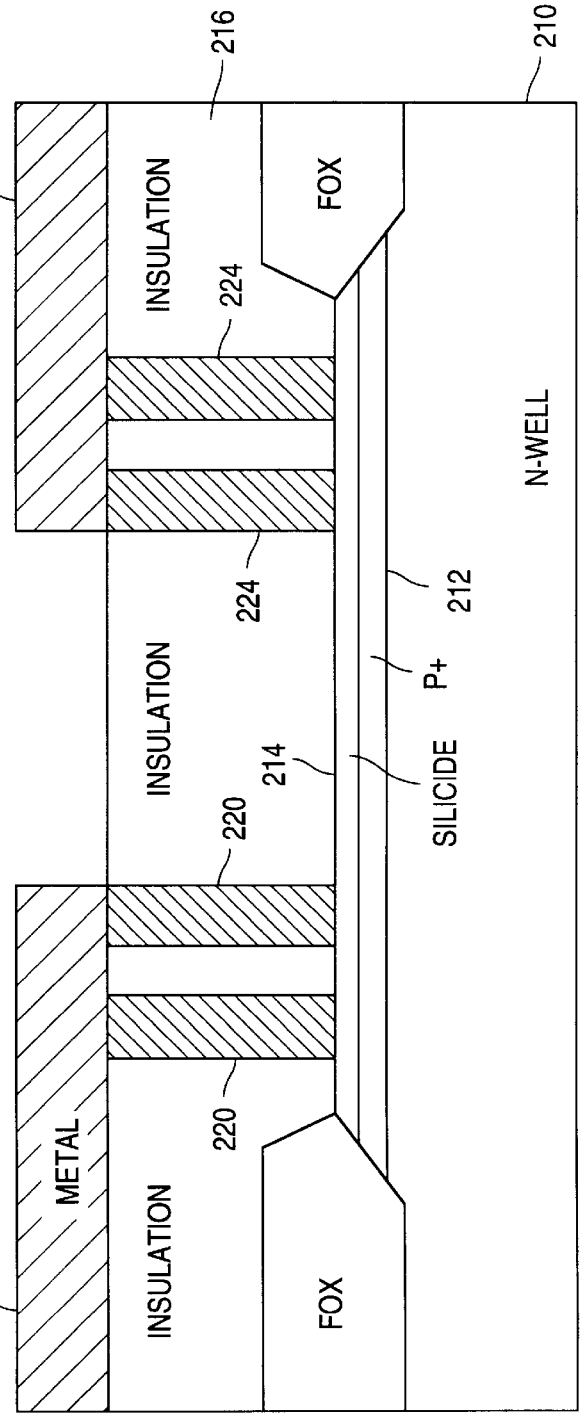
FIG. 3 is a cross-sectional view of antifuse 200 taken along line 3—3 of FIG. 2.

FIG. 2 shows a plan view that illustrates an antifuse 200 in accordance with the present invention. FIG. 3 shows a cross-sectional view of antifuse 200 taken along line 3—3 of FIG. 2. As described in greater detail below, antifuse 200 reduces the voltage required for programming by using a diffusion region with an overlying layer of silicide to form the antifuse.

As shown in FIGS. 2 and 3, antifuse 200 includes a p+ diffusion region 212 which is formed in a lightly-doped n-type semiconductor material 210, such as a well or a substrate, and surrounded by an isolating field oxide region FOX. (Rather than a p+ diffusion region being formed in a lightly-doped n-type semiconductor material, a n+ diffusion region can alternately be formed in a lightly-doped p-type semiconductor material.)

In addition, as further shown in FIGS. 2 and 3, antifuse 200 also includes a layer of $CoSi_2$ metal silicide 214 which is formed on diffusion region 212, and a layer of insulation material 216 which is formed on silicide layer 214 and the surrounding field oxide region FOX.

Further, antifuse 200 additionally includes one or more first contacts 220 which are connected to a first end 222 of silicide layer 214, and one or more second contacts 224 which are connected to a second end 226 of silicide layer 214. A first metal interconnect 230 is then connected to first contacts 220, while a second metal interconnect 232 is connected to second contacts 224.

In operation, when unprogrammed, a voltage is applied to semiconductor material 210 such that the diffusion region 212 to material 210 junction is not forward biased when a voltage within a range of operating voltages is placed on diffusion region 212 via first interconnect 230, second interconnect 232, or both first and second interconnects 230 and 232.

For example, if the voltage placed on metal interconnects 230 and 232 during normal operation ranges from ground to 3.3 volts, no appreciable current will flow across the junction if a blocking voltage equal to or greater than 3.3 volts is applied to material 210. Thus, for voltages less than 3.3 volts, the junction is reverse biased, while for a voltage equal to 3.3 volts, the junction is in equilibrium.

Antifuse 200 is programmed by heating $CoSi_2$ metal silicide layer 214 until silicide layer 214 agglomerates. One approach for heating silicide layer 214 is to pass an electric current laterally through silicide layer 214.

For example, if a first voltage, such as 3.3 volts, is applied to metal interconnect 230, a second voltage, such as ground, is applied to metal interconnect 232, and the first voltage is applied to material 210, a current will flow from interconnect 230 to interconnect 232 since the diffusion region 212 to material 210 junction is in equilibrium. The threshold power required to agglomerate silicide layer 214 is approximately 10 to 40 mW (calculated as the power delivered into the cold silicide).

Another approach for heating silicide layer 214 is to pass an electric current vertically through silicide layer 214 by forward biasing the diffusion region 212 to material 210 junction. For example, the junction is forward biased when 3.3 volts is placed on metal interconnect 230, metal interconnect 232, or both interconnects 230 and 232 while ground is placed on material 210.

Figure 4:
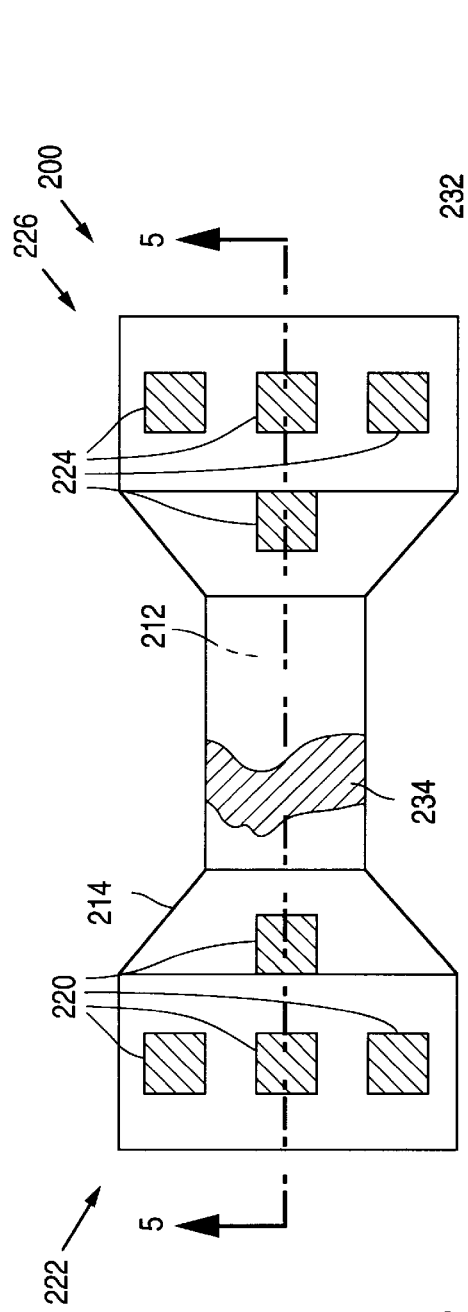
FIG. 4 shows a plan view that illustrates antifuse 200 when programmed in accordance with the present invention.
Figure 5:
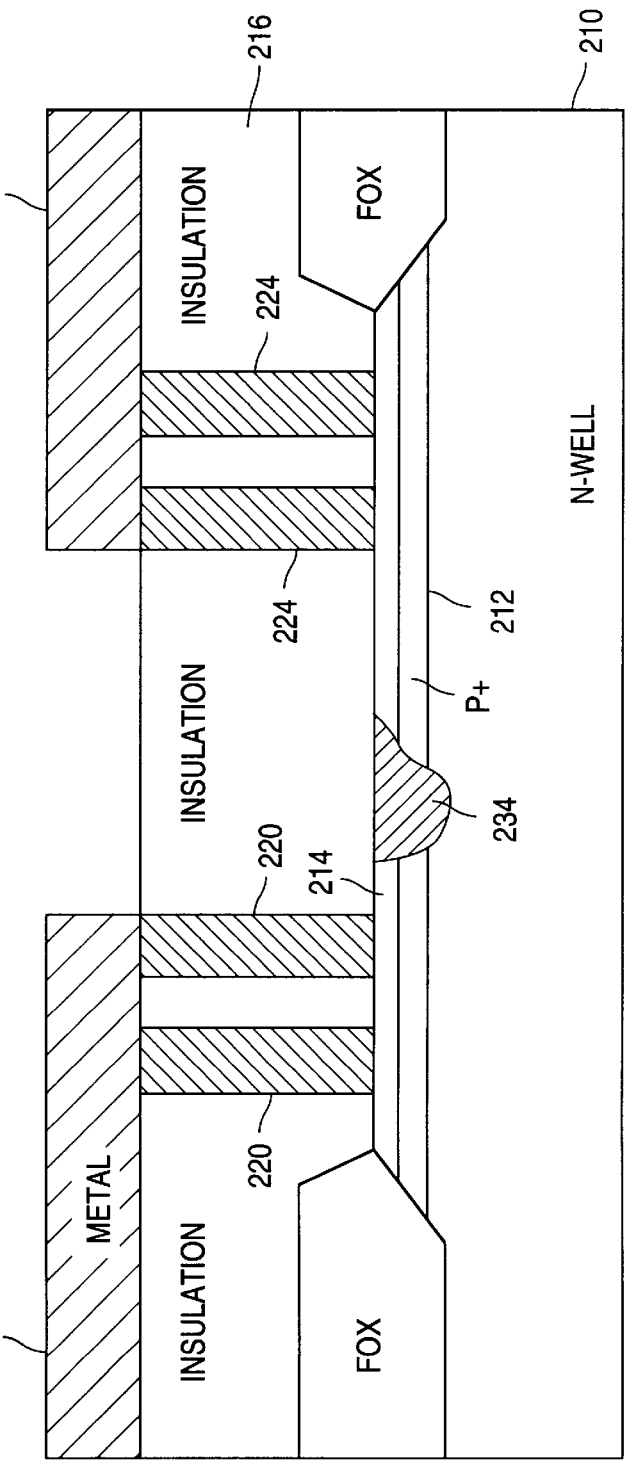
FIG. 5 shows a cross-sectional view of antifuse 200 taken along line 5—5 of FIG. 4.

FIG. 4 shows a plan view that illustrates antifuse 200 after programming in accordance with the present invention. FIG. 5 shows a cross-sectional view of antifuse 200 taken along line 5—5 of FIG. 4.

In accordance with the present invention, as shown in FIGS. 4 and 5, the agglomeration of $CoSi_2$ metal silicide layer 214 as a result of the resistive heating is accompanied by the formation of a deep spike 234 which extends through heavily-doped diffusion region 212 into material 210.

For example, a 0.3 micron thick heavily boron-doped diffusion region is almost completely spiked through since the heavily-doped diffusion region is relatively thin (after the silicidation process consumes some of the silicon in the diffusion region).

Spike 234, in turn, forms a Schottky-type contact between silicide layer 214 and the underlying lightly-doped silicon material 210. (Schottky-type contacts have a low forward voltage drop, e.g., 0.25 volts, and have a current flow based on majority carriers.)

One of the advantages of the present invention is that antifuse 200 can be formed in a conventional process without any additional process steps if the process forms contacts which are connected to a semiconductor material via a layer of cobalt silicide.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. An antifuse formed in a semiconductor material of a first conductivity type, the antifuse comprising:

a diffusion region of a second conductivity type formed in the semiconductor material, the diffusion region having a first end and a second end spaced apart from the first end;

a layer of metal silicide formed over the diffusion region, the layer of metal silicide having a first surface region located only over the first end of the diffusion region and a second surface region located only over the second end of the diffusion;

a layer of insulation material formed on the layer of metal silicide, the layer of insulation material having a first opening that exposes only the first surface region, and a second opening that exposes only the second surface region;

a first contact formed in the first opening to contact the layer of metal silicide;

a second contact formed in the second opening to contact the layer of metal silicide;

a first interconnect connected to the first contact; and a second interconnect connected to the second contact, the second interconnect being spaced apart from the first interconnect.

2. The antifuse of claim 1 wherein the metal silicide includes cobalt silicide.

3. The antifuse of claim 2 wherein the diffusion region is heavily doped with respect to the semiconductor material.

4. A method for using an unprogrammed antifuse, the antifuse being formed in a semiconductor material of a first conductivity type, and comprising:

a diffusion region of a second conductivity type formed in the semiconductor material, the diffusion region having a first end and a second end spaced apart from the first end;

a layer of metal silicide formed over the diffusion region, the layer of metal silicide having a first surface region located over the first end of the diffusion region and a second surface region located over the second end of the diffusion region;

a layer of insulation material formed on the layer of metal silicide, the layer of insulation material having a first opening that exposes the first surface region, and a second opening that exposes the second surface region;

a first contact formed in the first opening to contact the layer of metal silicide;

a second contact formed in the second opening to contact the layer of metal silicide;

a first interconnect connected to the first contact; and a second interconnect connected to the second contact, the second interconnect being spaced apart from the first interconnect;

the method comprising the step of applying a voltage to the semiconductor material such that the diffusion region to semiconductor material junction is not forward biased when a voltage within a range of operating voltages is on the diffusion region.

5. The method of claim 4 wherein the voltage is placed on the diffusion region via the first interconnect.

6. The method of claim 4 wherein the voltage is placed on the diffusion region via the first interconnect and the second interconnect.

7. The method of claim 4 wherein the metal silicide includes cobalt silicide.

8. The method of claim 4 wherein the diffusion region is heavily doped with respect to the semiconductor material.

9. A method for programming an antifuse, the antifuse being formed in a semiconductor material of a first conductivity type, and comprising:

a diffusion region of a second conductivity type formed in the semiconductor material, the diffusion region having a first end and a second end spaced apart from the first end;

a layer of metal silicide formed over the diffusion region, the layer of metal silicide having a first surface region located over the first end of the diffusion region and a second surface region located over the second end of the diffusion region;

a layer of insulation material formed on the layer of metal silicide, the layer of insulation material having a first opening that exposes the first surface region, and a second opening that exposes the second surface region;

a first contact formed in the first opening to contact the layer of metal silicide;

a second contact formed in the second opening to contact the layer of metal silicide;

a first interconnect connected to the first contact; and a second interconnect connected to the second contact, the second interconnect being spaced apart from the first interconnect;

the method comprising the step of heating the layer of metal silicide until the layer of metal silicide agglomerates.

10. The method of claim 9 wherein the layer of metal silicide is heated by passing a current through the layer of metal silicide.

11. The method of claim 10 wherein the current is induced by applying a first voltage to the first interconnect, a second voltage to the second interconnect, and a third voltage to the semiconductor material, the first and second voltages being different, the diffusion region to semiconductor material junction not being forward biased.

12. The method of claim 11 wherein the first and third voltages are substantially equal.

13. The method of claim 10 wherein the current is induced by applying a first voltage to the first interconnect and a second voltage to the semiconductor material, the diffusion region to semiconductor material junction being forward biased.

14. A programmed antifuse formed in a semiconductor material of a first conductivity type, the antifuse comprising:

a diffusion region of a second conductivity type formed in the semiconductor material, the diffusion region having a first end and a second end spaced apart from the first end;

a layer of metal silicide formed over the diffusion region, the layer of metal silicide having a first surface region located over the first end of the diffusion region, a second surface region located over the second end of the diffusion region, and a spiked-shaped region that extends through the diffusion region into the semiconductor material;

a layer of insulation material formed on the layer of metal silicide, the layer of insulation material having a first opening that exposes the first surface region of the layer of metal silicide, and a second opening that exposes the second surface region of the layer of metal silicide;

a first contact formed in the first opening to contact the layer of metal silicide;

a second contact formed in the second opening to contact the layer of metal silicide;

a first interconnect connected to the first contact; and a second interconnect connected to the second contact, the second interconnect being spaced apart from the first interconnect.

15. An antifuse formed in a substrate of a first conductivity type, the antifuse comprising:

a diffusion region of a second conductivity type formed in a region of the substrate, the diffusion region having a first end and a second end spaced apart from the first end;

a layer of metal silicide formed over the diffusion region, the layer of metal silicide having a first surface region located over the first end of the diffusion region and a second surface region located over the second end of the diffusion;

a layer of insulation material formed on the layer of metal silicide, the layer of insulation material having a first opening that exposes the first surface region, and a second opening that exposes the second surface region;

a first contact formed in the first opening to contact the layer of metal silicide;

a second contact formed in the second opening to contact the layer of metal silicide;

a first interconnect connected to the first contact; and a second interconnect connected to the second contact, the second interconnect being spaced apart from the first interconnect.

16. The antifuse of claim 15 wherein the region of the substrate is a well.

17. The antifuse of claim 15 wherein the diffusion region has a substantially uniform dopant concentration.

18. The antifuse of claim 14 wherein the metal silicide includes cobalt silicide.

19. The antifuse of claim 15 wherein the diffusion region is heavily doped with respect to the semiconductor material.

20. The antifuse of claim 15 wherein the metal silicide includes cobalt silicide.

* * * * *